(12) United States Patent
Arad et al.

(10) Patent No.: US 8,335,484 B1
(45) Date of Patent: Dec. 18, 2012

(54) SYSTEMS AND METHODS FOR DYNAMICALLY CONTROLLING AN ANALOG-TO-DIGITAL CONVERTER

(75) Inventors: Oren Arad, Palo Alto, CA (US); Sridhar Sharma, Milpitas, CA (US)

(73) Assignee: SiPort, Inc., Santa Clara, CA (US)

( * ) Notice: Subject to any disclaimer, the term of this patent is extended or adjusted under 35 U.S.C. 154(b) by 586 days.

(21) Appl. No.: 11/496,767

(22) Filed: Jul. 31, 2006

Related U.S. Application Data (60) Provisional application No. 60/703,362, filed on Jul. 29, 2005.

(51) Int. Cl.
  *H04B 1/16* (2006.01)
(52) U.S. Cl. .................. 455/343.2; 455/67.11; 455/574
(58) Field of Classification Search ............ 455/67.11, 455/67.13, 574, 226.1–226.3, 230, 343.2; 341/131, 139, 142, 155, 156
See application file for complete search history.

(56) References Cited

U.S. PATENT DOCUMENTS

| | | | |
|---|---|---|---|
| 4,710,747 A * | 12/1987 | Holland ................... | 341/120 |
| 4,761,644 A | 8/1988 | Kawai et al. | |
| 4,910,752 A * | 3/1990 | Yester et al. ................ | 375/316 |
| 5,140,698 A | 8/1992 | Toko | |
| 5,155,479 A | 10/1992 | Ragan | |
| 5,325,088 A | 6/1994 | Willard et al. | |
| 5,555,183 A | 9/1996 | Willard et al. | |
| 5,640,670 A * | 6/1997 | Samueli et al. ............... | 725/70 |
| 5,654,952 A | 8/1997 | Suzuki | |
| 5,870,439 A * | 2/1999 | Ben-Efraim et al. ......... | 375/346 |
| 5,920,824 A | 7/1999 | Beatty et al. | |
| 6,031,827 A | 2/2000 | Rikkinen et al. | |
| 6,057,795 A | 5/2000 | Suzuki | |
| 6,072,784 A | 6/2000 | Agrawal et al. | |
| 6,205,225 B1 | 3/2001 | Orban | |
| 6,219,333 B1 | 4/2001 | Ahn | |
| 6,232,905 B1 * | 5/2001 | Smith et al. ................. | 341/155 |
| 6,259,681 B1 | 7/2001 | Kolev et al. | |
| 6,286,122 B1 | 9/2001 | Alanara | |
| 6,311,048 B1 | 10/2001 | Loke | |
| 6,317,065 B1 * | 11/2001 | Raleigh et al. ............... | 341/139 |
| 6,405,062 B1 | 6/2002 | Izaki | |
| 6,405,602 B1 | 6/2002 | Itou et al. | |
| 6,407,689 B1 * | 6/2002 | Bazarjani et al. ............ | 341/143 |
| 6,438,364 B1 | 8/2002 | Waite | |
| 6,466,913 B1 | 10/2002 | Yasuda | |
| 6,504,863 B1 * | 1/2003 | Hellmark .................... | 375/219 |
| 6,654,595 B1 | 11/2003 | Dexter | |
| 6,671,371 B1 | 12/2003 | McNeill et al. | |
| 6,693,953 B2 * | 2/2004 | Cox et al. ..................... | 375/141 |
| 6,754,763 B2 | 6/2004 | Lin | |
| 6,763,240 B1 | 7/2004 | Chambers | |

(Continued)

FOREIGN PATENT DOCUMENTS

JP   2007-243504   *   9/2007

*Primary Examiner* — Duc M Nguyen
(74) *Attorney, Agent, or Firm* — Carr & Ferrell LLP (57) ABSTRACT

Systems and methods for dynamically controlling an analog-to-digital converter (ADC) in order to conserve power are provided. In exemplary embodiments, a receiver device comprises a tuner configured to receive a signal, at least one programmable analog-to-digital converter (ADC), and a digital signal processing hardware comprising a control logic. The exemplary control logic is configured to generate a control signal to configure components within the receiver device to conserve power at the ADC.

19 Claims, 8 Drawing Sheets

U.S. PATENT DOCUMENTS

| | | |
|---|---|---|
| 6,765,931 B1 | 7/2004 | Rabenko et al. |
| 6,819,274 B2 * | 11/2004 | Krone et al. ............... 341/141 |
| 6,862,325 B2 | 3/2005 | Gay-Bellile et al. |
| 6,864,817 B1 * | 3/2005 | Salvi et al. ................. 341/139 |
| 6,993,291 B2 * | 1/2006 | Parssinen et al. .......... 455/67.11 |
| 7,006,617 B1 * | 2/2006 | Dal Farra et al. ........ 379/206.01 |
| 7,127,008 B2 * | 10/2006 | Kroeger ..................... 375/321 |
| 7,205,923 B1 * | 4/2007 | Bahai ......................... 341/161 |
| 7,233,275 B2 * | 6/2007 | Aksin et al. ................. 341/162 |
| 7,295,812 B2 | 11/2007 | Haapoja et al. |
| 7,299,021 B2 | 11/2007 | Pärssinen |
| 7,302,013 B2 * | 11/2007 | Samueli et al. ............. 375/316 |
| 7,369,989 B2 | 5/2008 | Absar |
| 7,480,689 B2 | 1/2009 | Song |
| 7,512,743 B2 | 3/2009 | Tom et al. |
| 7,519,330 B2 * | 4/2009 | Gumm ....................... 455/67.11 |
| 7,555,661 B2 * | 6/2009 | Luu ............................ 713/320 |
| 2002/0067825 A1 | 6/2002 | Baranowski et al. |
| 2002/0126778 A1 * | 9/2002 | Ojard et al. ................. 375/346 |
| 2002/0169009 A1 | 11/2002 | Reiner |
| 2003/0078007 A1 * | 4/2003 | Parssinen et al. ........... 455/67.1 |
| 2003/0159076 A1 | 8/2003 | Delisle |
| 2004/0080675 A1 | 4/2004 | Hoshino |
| 2004/0145508 A1 * | 7/2004 | Gulati et al. ................. 341/155 |
| 2004/0203537 A1 | 10/2004 | Yoshida et al. |
| 2004/0223449 A1 | 11/2004 | Tsuie et al. |
| 2005/0047488 A1 | 3/2005 | Sugahara |
| 2005/0081245 A1 | 4/2005 | Arad et al. |
| 2005/0094036 A1 | 5/2005 | Tichelaar |
| 2005/0094840 A1 | 5/2005 | Harano |
| 2005/0113136 A1 | 5/2005 | Gosieski, Jr. |
| 2005/0239518 A1 | 10/2005 | D'Agostino et al. |
| 2006/0001779 A1 * | 1/2006 | Favrat et al. ................. 348/725 |
| 2006/0003729 A1 * | 1/2006 | Tuttle et al. .................. 455/333 |
| 2006/0082690 A1 | 4/2006 | Englert |
| 2006/0112157 A1 | 5/2006 | Song |
| 2006/0141974 A1 * | 6/2006 | Campbell et al. ............ 455/318 |
| 2006/0195498 A1 | 8/2006 | Dobbek |
| 2006/0212503 A1 | 9/2006 | Beckmann |
| 2007/0080800 A1 | 4/2007 | Carbone |
| 2007/0105576 A1 | 5/2007 | Gupta et al. |
| 2007/0112901 A1 | 5/2007 | Niktash |
| 2007/0176816 A1 * | 8/2007 | Wood ........................... 341/155 |
| 2008/0097764 A1 | 4/2008 | Grill |
| 2009/0198753 A1 | 8/2009 | Benjelloun Touimi |

* cited by examiner

SYSTEMS AND METHODS FOR DYNAMICALLY CONTROLLING AN ANALOG-TO-DIGITAL CONVERTER

CROSS-REFERENCE TO RELATED APPLICATION

The present application claims the priority benefit of U.S. Provisional Patent Application No. 60/703,362 entitled "System and Methods for Dynamic Control of ADC" filed Jul. 29, 2005, which is herein incorporated by reference.

The present application is also related to U.S. patent application Ser. No. 11/454,268 entitled "Systems and Methods for Dynamically Controlling a Tuner" filed Jun. 16, 2006, which is also herein incorporated by reference.

BACKGROUND OF THE INVENTION

1. Field of Invention

Embodiments of the present invention are related to audio processing, and more particularly to control of an analog-to-digital converter.

2. Related Art

Conventionally, wireless communication reception in mobile devices requires use of high performance receivers that comply with stringent power consumption constraints. A receiver for broadcast services is expected to provide reliable reception under multiple channel impairments such as multipath fading, Doppler shift, and additive noise. A high performance implementation of the receiver can achieve significant improvement of reception range and indoor coverage. Communication and broadcast systems which use terrestrial transmitters have particularly high requirements for receiver performance. A transmission band is often populated with an ensemble of high power broadcast transmission of terrestrial analog TV and radio, as well as aeronautical and governmental transmissions. Receivers receiving terrestrial broadcast signal are typically required to handle a large dynamic range of both a signal of interest and signals in adjacent channels.

In a digital receiver implementation, an analog signal at a tuner output is sampled by an analog-to-digital converter (ADC). The sampled signal is then demodulated by a digital signal processing means. The analog signal at the tuner output typically contains the signal of interest, as well as undesired signals coming from adjacent channels. These undesired signals may have very high power relative to the signal of interest.

There are several methods that receivers can use to handle the large dynamic range of the received signals. One such method is to implement analog selectivity filters. These analog selectivity (i.e., band selective) filters are centered on a channel of interest and reject adjacent channels. A drawback of such a design is complexity of the analog filter design. In order to provide high selectivity, the filters need to be of high order (i.e., incorporate multiple zeros and poles) thus requiring a plurality of components such as amplifiers, capacitors, resistors, and inductors. This is particularly prohibitive for silicon tuner design where the filter consumes a large silicon area, and therefore increases chip cost.

Another approach to handling adjacent channels is to sample the received signal using an analog-to-digital converter (ADC), and filter the adjacent channels using digital filters. Digital filters can be designed to be very sharp and very small in chip area. The challenge in such an approach is to have an ADC with sufficient resolution to accommodate a dynamic range of the channel of interest and the adjacent channels. Additionally, a high resolution ADC consumes much more power than an ADC with less resolution.

Therefore, there is a need for a receiver system capable of handling high power adjacent channels. There is also a need for a receiver system with low average power consumption, particularly for mobile and handheld devices.

SUMMARY OF INVENTION

Embodiments of the present invention provide systems and methods for dynamic controlling an analog-to-digital converter (ADC) in order to reduce power consumption. In exemplary embodiments, a radio receiver comprises a tuner configured to receive a signal, at least one programmable analog-to-digital converter (ADC), and a digital signal processing hardware comprising a control logic. The exemplary control logic is configured to generate a control signal to configure components within the receiver device to conserve power at the ADC.

DETAILED DESCRIPTION OF EXEMPLARY EMBODIMENTS

Embodiments of the present invention provide for adaptively optimized power consumption of a receiver device based on instantaneous performance requirements that are necessary for reliable reception. The exemplary system provides a radio receiver comprising at least one analog-to-digital converter (ADC), a tuner, and a digital signal processing hardware (DSPHW). In exemplary embodiments, ADC resolution is dynamically controlled to reduce power and/or increase resolution. The DSPHW is configured to analyze a received signal and channel characteristics in order to control the ADC resolution and optimize power consumption and performance.

Figure 1:
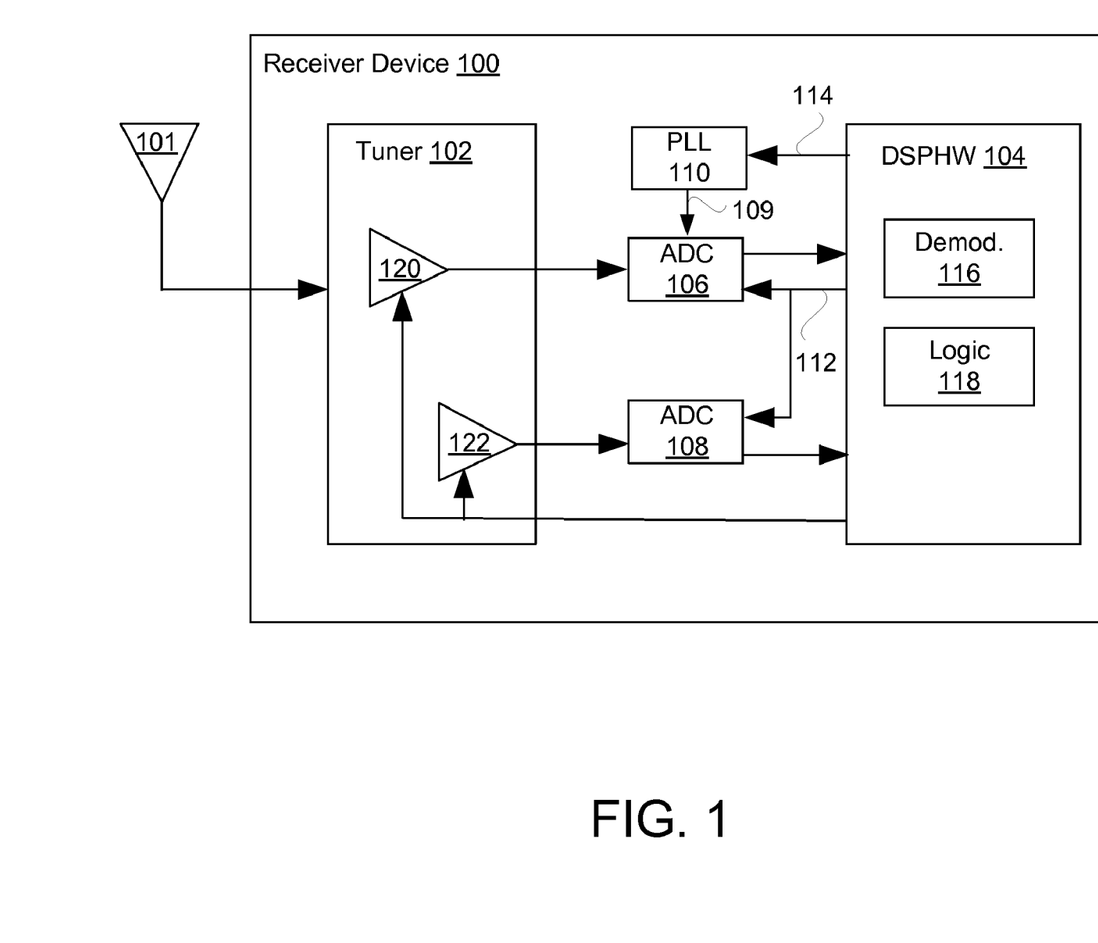
FIG. 1 is a block diagram of an exemplary receiver device.

FIG. 1 is a block diagram of an exemplary receiver device 100 configured to receive communication signals transmitted over a radio frequency (RF). In exemplary embodiments, the signals are received via an antenna 101. The receiver device 100 comprises a tuner 102 and a digital signal processing hardware (DSPHW) 104. The tuner 102 is configured to receive a signal through a desired communication channel transmitted over a specific RF band, and down-convert the received signals from the communication channel to some intermediate frequency (IF) or to zero frequency. The down-converted signals can then be sampled by at least one analog-to-digital convert (ADC) 106 to form a digital representation of the down-converted signal.

In an alternative embodiment, two signals may be produced by the tuner 102 corresponding to an in-phase and quadrature phase representation of the received signal. In this embodiment, two ADCs 106 and 108 are used to sample the in-phase and quadrature phase representation to form a digital representation of the tuner 102 output signals. Embodiments of the present invention may operate with a receiver device 100 comprising one, two, or any plurality of ADCs used to sample the tuner 102 output signals. While some embodiments of the present invention will be described below using a single ADC to form the digital representation, it will be clear to one skilled in the art that the described methods may be applicable to embodiments comprising a plurality of ADCs.

In exemplary embodiments, the ADC 106 is clocked in order to change a sampling clock rate. Accordingly, a phase-locked-loop (PLL) 110 is coupled to the ADC 106 to clock the ADC 106. By way of example but not limitation, PLL 110 may provide a sine wave 109 to ADC 106. In an alternative embodiment, the ADC 106 is clocked directly from a crystal oscillator. In yet a further embodiment, the crystal oscillator clock output or the PLL 110 clock output is divided by a clock dividing circuitry (not shown) to produce a reduced rate clock for the ADC 106. The clock dividing circuitry may be controlled by the DSPHW 104.

In exemplary embodiments, the DSPHW 104 comprises digital logic circuitry (e.g., demodulator 116) in order to demodulate the sampled signal and recover information that is modulated in the sampled signal. The demodulation methods performed by the demodulator 116 depend on a transmitted signal type. For example, the transmission may be DAB or T-DMB broadcast. In this case a differential quadrature phase shift key (DQPSK) is used, and demodulation methods for such transmission as known to one skilled in the art are utilized. In another example, analog frequency modulation (FM) is used for which methods for demodulating such signal are also known to one skilled in the art.

The DSPHW 104 can further comprise digital logic circuitry 118 for performing other actions. For example, a power measurement logic is configured to measure average power of the sampled, received signal at an output of the ADC 106. The power measurement logic may be further configured to measure a signal power after digitally filtering adjacent channels. In one embodiment, the power management logic is embodied within the demodulator 116. In alternative embodiments, the power measurement logic and/or the digital logic circuitry 118 may reside outside of the demodulator 116 but be coupled thereto.

The DSPHW 104 uses the power measurements to calculate a power level of the desired signal relative to a power level of other undesired signals. The DSPHW 104 may also use the power measurements to calculate a level of the desired signal relative to an ADC noise floor. Based on these analyses, the DSPHW 104 controls the ADC 106 and, optionally, ADC 108 via a bus 112. The DSPHW 104 also controls the PLL 110 via a bus 114 to adjust resolution and power consumption of the ADC 106 and, optionally, ADC 108. The various calculations and generation of control signals may be performed by further digital logic circuitry 118 in the DSPHW 104, for example, a digital logic ADC management logic. In alternative embodiments, the ADC management logic functionality may be implemented by a programmable processor as part of the demodulation execution sequence performed by a programmable processor.

In some embodiments, the tuner 102 may comprise an automatic gain control (AGC) 120 unit configured to control power of the signal at an input to the ADC 106. The gain that the AGC 120 may also be controlled by the DSPHW 104, such that the signal power is set to a desired level at the input of the ADC 106 to prevent clipping of the signal by the ADC 106. In embodiments comprising two ADCs 106 and 108, a second AGC 122 is provided in the tuner 102. In exemplary embodiments, the AGC 120 or 122 is an amplifier.

The tuner 102 may also comprise band limiting filters (not shown). These band limiting filters pass energy of the desired signal to the ADC 106 and 108, while rejecting energy of undesirable signals which reside in frequencies in proximity to the desired signal. Because of physical limitations, these band limiting filters may only provide finite attenuation to the undesired signals, according to some embodiments. Therefore, some of the energy of the undesired signals may still reach the ADC 106 input.

Figure 2:
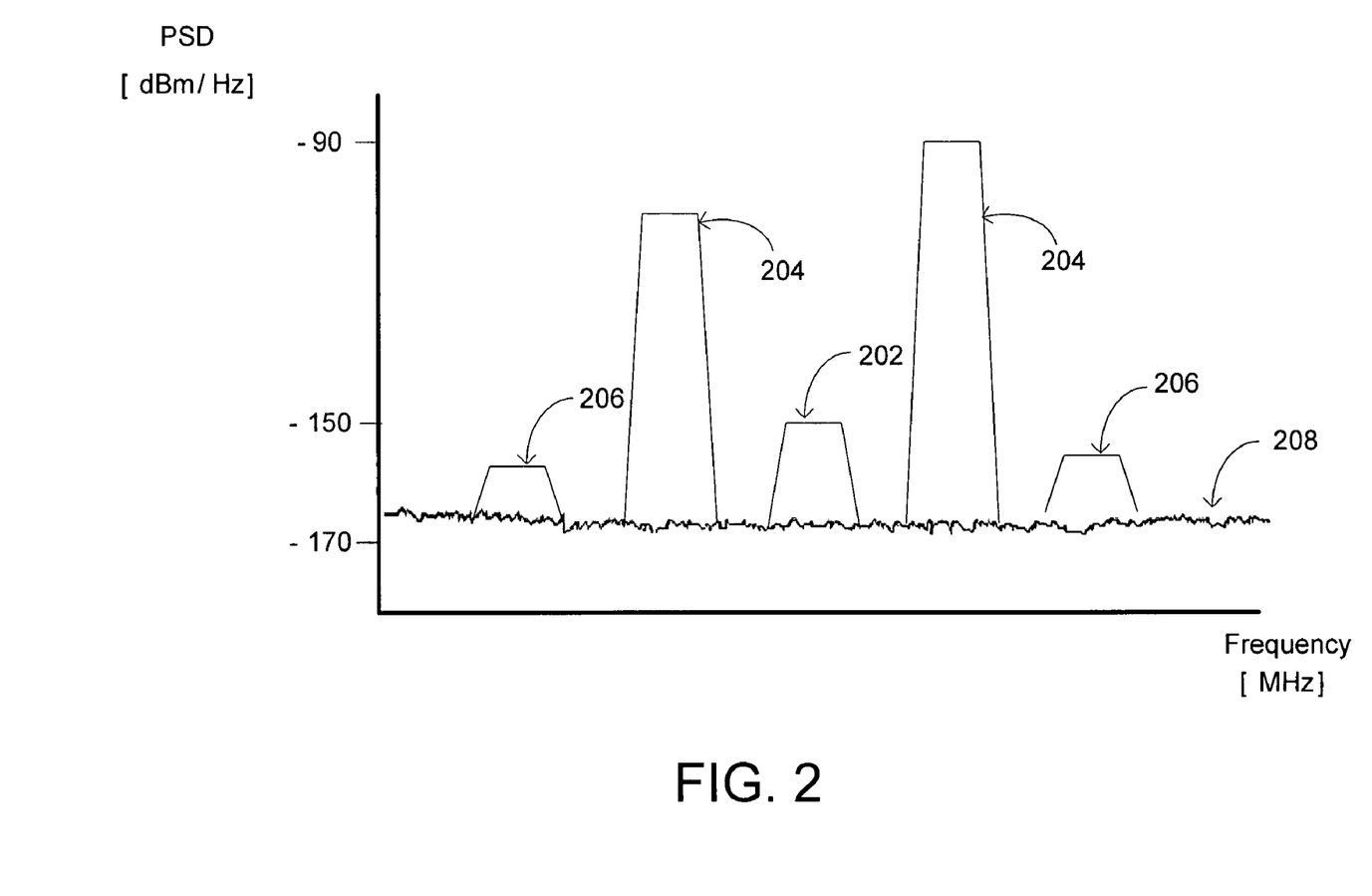
FIG. 2 shows a plot of power spectral density of radio frequency containing a signal of interest and other out of band signals.

Referring now to FIG. 2, an exemplary plot of power spectral density of the signals received at an input to the ADC 106 is shown. The receiver device 100 is tuned to demodulate a signal of interest 202. In addition to the signal of interest 202, there is a plurality of other signals present in the RF spectrum outside a band of the signal of interest 202. These signals include blocker signals 204, which are shown as having a much higher power spectral density than the signal of interest 202. Other signals may be interfering signals 206 having lower power spectral density than the signal of interest. Furthermore, the signal of interest 202 can be received at a power level which is close to power of an in-band noise floor 208.

In exemplary embodiments, the ADC 106 and 108 have a finite dynamic range at its input. The dynamic range is defined as a ratio between a noise floor 208 level, and a highest power sinusoid signal that the ADC 106 and 108 can sample without saturation. This dynamic range can be expressed as:

$$\text{Dynamic\_range}=\text{Max\_power}/\text{noise\_floor\_power},$$

or in units of decibels (dB):

$$\text{Dynamic\_range\_dB}=\text{Max\_power\_dB}/\text{noise\_floor\_power\_dB},$$

where the suffix_dB is added to any power measurement that is represented in decibel units (e.g., Dynamic_range_dB=10*log 10(Dynamic_range)).

As previously described, the tuner 102 also comprises a gain control circuitry (e.g., AGC 120). This gain control circuitry controls a total power at the ADC 106 input to insure that $$\text{Max\_power\_dB} \geq \text{Clip\_margin\_dB}+10*\log 10(\text{undesired\_power}+\text{desired\_power}),$$

where "desired_power" ($P_{DES}$) is a power of the signal of interest 202 at the ADC 106 input, and "undesired_power" is a combined power of all of the undesired signals at the ADC 106 input. "Clip_margin" is a power headroom (e.g., difference) between the "Max_power" and a "total_signal_power" "Total_signal_power" is defined as "undesired_power+desired_power" at the ADC 106 input. In exemplary embodiments, "clip_margin" prevents clipping of the signal of interest due to an amplitude distribution of the input signal.

In order to allow for reliable detection by the ADC 106, the dynamic range of the ADC 106 is large enough to be able to sample the input signal while providing some margin to prevent clipping. The dynamic range is also sufficient to provide enough margin between the signal of interest 202 and the noise floor 208. These noise margins are specific to a type of communication system in use. Therefore, the ADC 106 may be designed with a dynamic range that maintains the following relationship:

$$\text{Dynamic\_range\_dB} \geq \text{Clip\_margin\_dB} + 10*\log 10(\text{undesired\_power} + \text{desired\_power}) + \text{noise\_floor\_margin\_dB},$$

where "noise_floor_margin" is a difference between power of the signal of interest 202 and an integrated power of the noise floor 208 inside the band of the desired signal (i.e., signal of interest). The "noise_floor_margin" may be dependent on a type of communication in use in order to allow reliable detection. It is known to one skilled in the art what the "noise_floor_margin" may be for reliable detection of such a communication system. Various embodiments of the present invention may assume that the "noise_floor_margin" is known and can be stored in the receiver device 100.

The required dynamic range of the ADC 106 may also be expressed as effective number of bits (ENOB). In one embodiment, ENOB is calculated as (Dynamic_range_dB−1.76)/6.02. This equation is known in the art and therefore is not derived herein.

In many communication systems, the power of the desired signal, as well as the power of the undesired signals, can vary by many dBs as a function of time, receiver location, and/or signal frequency. Accordingly, a minimum dynamic range that is required to provide reliable demodulation of the desired signal varies as a function of time, receiver location, and/or signal frequency.

In ADC design, a fundamental trade-off exists between the ENOB that a specific ADC (e.g., ADC 106) provides and the power that the ADC 106 consumes. For a given sampled signal bandwidth, $S_{BW}$, the ADC 106 power consumption may grow exponentially as the ENOB grows. A rough approximation of a relationship between the ENOB and the power consumption that is consumed by the ADC 106 is as follows:

$$P_{ADC} \approx Ke*S_{BW}*2^{ENOB},$$

where "$P_{ADC}$" is the ADC 106 power. "Saw" is a sampled signal bandwidth. Finally, "Ke" is an efficiency constant that depends on efficiency of the ADC 106 design.

As a result, the power consumption of the ADC 106 increases approximately in proportion to two (2) to the power of the ENOB. Therefore, it is beneficial to reduce the ENOB that the ADC 106 provides at any given time in order to reduce power consumption of the ADC 106, and therefore the power consumption of the receiver device 100.

Embodiments of the present invention take advantage of variations of the power of the undesired signal and the desired signal (e.g., a variation in the required dynamic range) to minimize the power consumption of the ADC 106. Embodiments of the present invention also provide a system comprising the configurable ADC 106 circuitry configured to provide a plurality of ENOB configurations. In one embodiment, the PLL 110 circuitry, and the DSPHW 104 configured to control the ADC 106 resolution and the PLL 110 clock rate.

Figure 3:
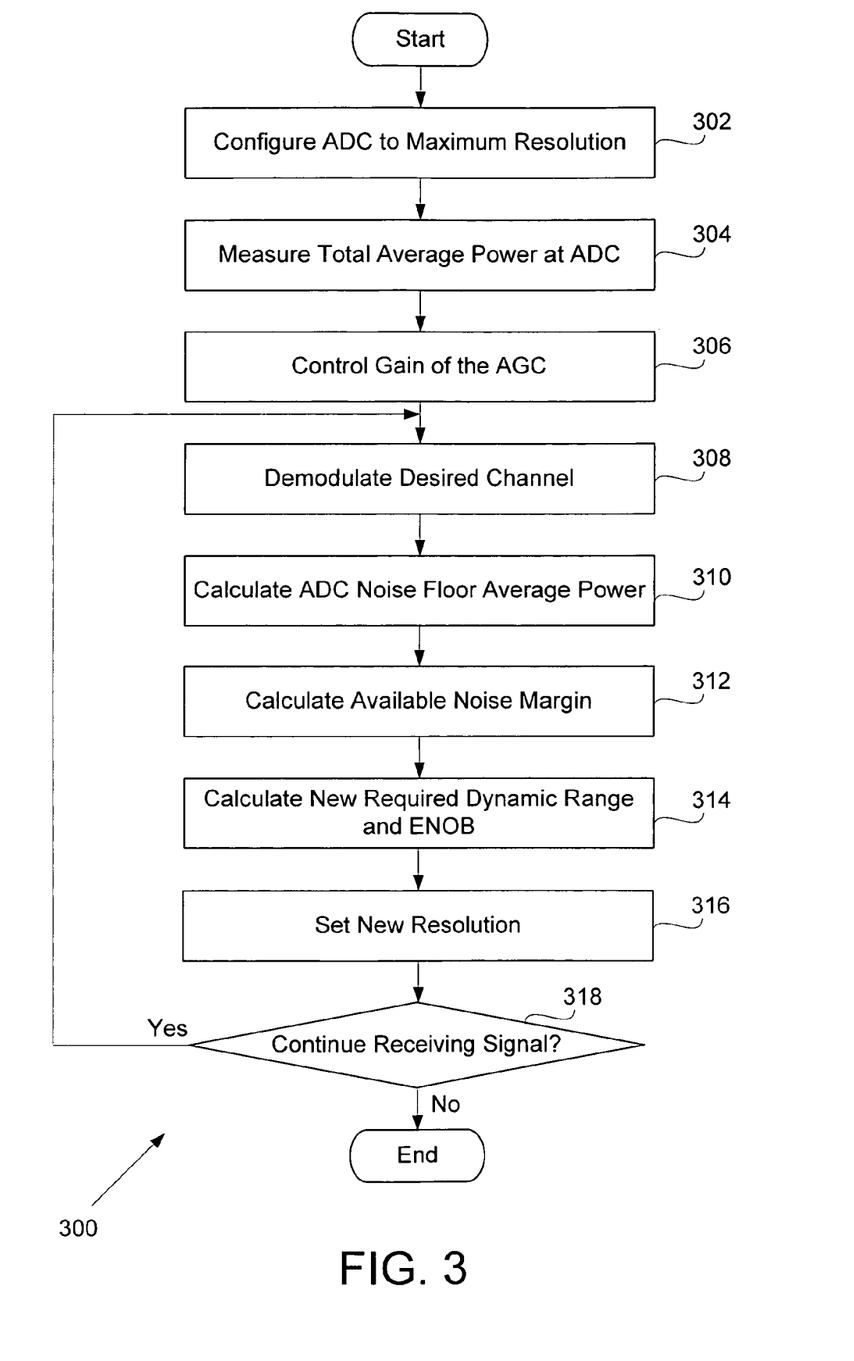
FIG. 3 is a flowchart of an exemplary method for calculating a minimum required resolution for the ADC and configuring the ADC to provide a required resolution.

Referring now to FIG. 3, a flowchart 300 of an exemplary method for calculating a minimum required resolution for the ADC 106, and configuring the ADC 106 to provide the required resolution is shown. In step 302, the DSPHW 104 configures the ADC 106 to a maximum resolution available. This configuration may take place upon system start or when a new receiving channel is selected. As a result, Dynamic_range_dB=Max_power_dB/noise_floor_power_dB.

In step 304, the DSPHW 104 measures a total average power consumed by the ADC 106 to produce the $P_{ADC}$ measurement. As previously discussed, $P_{ADC} \approx Ke*S_{BW}*2^{ENOB}$.

In step 306, the DSPHW 104 controls a gain (G) of the AGC 120, such that Max_power_dB=Clip_margin_dB+10*log 10($G*P_{ADC}$). As a result, the input signal power at the ADC 106 input is set to "Clip_margin_dB" decibels below the maximum power that the ADC 106 can take without saturation.

The DSPHW 104 demodulates the desired channel in step 308. As part of the demodulation, the DSPHW 104 performs channel selective filtering according to exemplary embodiments. This filtering may remove most of the power of the adjacent channels. At the output for the channel selective filters, the DSPHW 104 measures the average power of the desired signal ($P_{DES}$). When calculating $P_{DES}$, the DSPHW 104 divides the power measurement of the desired signal by all digital gain factors from the ADC 106 input to the point of measurement in order to produce the normalized gain measurement (G).

In step 310, the DSPHW 104 calculates the ADC noise floor 208 average power inside the desired signal bandwidth. In exemplary embodiments, the calculation is as follows:

$$P_{noise} = PSD_{noise} - 10*\log 10(BW_{ADC}/BW_{DES}),$$

where "$PSD_{noise}$" is a known power spectrum density of the noise floor 208 at the ADC 106 output. $PSD_{noise}$ comprises known components of the noise coming from a tuner analog circuitry, the ADC analog circuitry, and a quantization noise of the ADC 106. "$BW_{DES}$" is a desired signal bandwidth, while "$BW_{ADC}$" is an ADC sampled bandwidth.

The DSPHW 104 calculates an available noise margin between the desired channel power and the noise floor 208 in step 312. In exemplary embodiments, the calculation is as follows:

$$\text{Available\_margin\_dB} = 10*\log 10(P_{DES}) - 10*\log 10(P_{noise})$$

Next in step 314, the DSPHW 104 calculates a new required dynamic range and required ENOB as follows:

$$\text{Spare\_Margin\_dB} = \text{Available\_margin\_dB} - \text{noise\_floor\_margin\_dB}$$

$$\text{New\_Dynamic\_range\_dB} = \text{Dynamic\_range\_dB} - \text{Spare\_Margin\_dB}$$

$$\text{New\_ENOB} = (\text{New\_Dynamic\_range\_dB} - 1.76)/6.02,$$

where noise_floor_margin_dB is a pre-determined constant that provides a sufficient margin between the signal power ($P_{DES}$) and the noise power ($P_{noise}$), to ensure reliable demodulation of the desired signal.

In step 316, the DSPHW 104 controls the ADC 106 and the PLL 110 to set the required new resolution "New_ENOB." The DSPHW 104 also is configured to control the AGC 120 to set a new gain "G_new" as follows:

$$\text{Max\_power\_new\_dB} = \text{Clip\_margin\_dB} + 10*\log 10(G\_new*P_{ADC}),$$

where "Max_power_new_dB" is a new max power that the ADC 106 can tolerate without clipping after the new resolution is set.

In step 318, a determination is made as to whether a signal is still being received. If so, the DSPHW 104 repeats steps 308 through 316, in order to set the required resolution. This process will continued so long as a signal is being received by the receiving device 100.

In embodiments where "Spare_Margin_dB" is positive, the ADC 106 resolution will be reduced. As a result, the power consumption of the ADC 106 will be reduced. In embodiments where "Spare_Margin_dB" is negative, the resolution of the ADC 106 will increase. As a result, the power consumption of the ADC 106 will increase.

The above description provides various embodiments configured to calculate a required resolution for the ADC 106 and adjusting the ADC 106 resolution in order to reduce the power consumption by the ADC 106. The following description provides exemplary methods for implementing an ADC 106 configured to change resolution while changing power consumption of the ADC 106.

One exemplary ADC 106 circuit is a Sigma Delta ADC (SD-ADC). In the SD-ADC, an input signal is sampled at a frequency much higher than the Nyquist frequency. A quantization noise floor in the SD-ADC is shaped such that it is lower in a bandwidth of the signal. In exemplary embodiments, the SD-ADC is followed by at least one digital decimation filter that reduces a sampling frequency, while gaining resolution. In a Sigma Delta design, a higher frequency translates into a lower quantization noise floor when the sampled signal is decimated with the appropriate decimation filters. The lower noise floor will be converted into a higher output resolution. It is well known to one skilled in the art as to how to construct the SD-ADC with a specific over-sampling rate, and convert the over-sampled signal into a signal with increased resolution using digital decimation filters.

In some embodiments, the SD-ADC design may be used in conjunction with a programmable PLL (e.g., PLL 110) capable of generating a range of sampling clocks, and in conjunction with a programmable digital decimation filter to produce an ADC output signal with variable resolution. Furthermore, these embodiments may be used in conjunction with the embodiments described above in order to dynamically adjust the resolution of the ADC 106 to the minimum resolution required.

The power consumption of the SD-ADC is reduced approximately in proportion to a reduction in a sampling frequency of the SD-ADC. For example, by reducing the sampling frequency of the SD-ADC by a factor of 2, the power consumption of the SD-ADC is reduced to approximately ½ of the power consumption. In addition, when the sampling rate of the SD-ADC is reduced, the resolution of the signal at the SD-ADC output is also reduced. Therefore, changing the sampling rate of the SD-ADC provides a method for reducing power consumption of the ADC 106 while providing reduced resolution.

With respect to these embodiments, the DSPHW 104 calculates the ENOB required for reception in step 314. In step 316, the DSPHW 104 will determine a sampling rate required for the SD-ADC (e.g., using a pre-known formula or a look-up table) in order to produce the required ENOB. The DSPHW 104 then programs the PLL 110 to produce a sampling clock at the required rate. The DSPHW 104 will also program the decimation filters subsequent to the SD-ADC in order to decimate the output of the SD-ADC.

In an exemplary embodiment of the present invention, the SD-ADC comprises an integrator implemented using an amplifier and capacitor. The amplifier may be biased with a certain biasing voltage to ensure proper operation. When increasing the biasing voltage of the amplifier, a noise figure of the amplifier is reduced. As a result, the signal at the output of the amplifier has a reduced noise component. Conversely, reducing the biasing voltage of the amplifier causes the noise figure of the amplifier to increase. As a result, the signal at the output of the amplifier has an increased noise component. Also when increasing the bias voltage, the power consumption of the amplifier increases. Similarly, when reducing the bias voltage of the amplifier, the power consumption decreases. The design of amplifier circuitry and the use of amplifier circuitry in the SD-ADC are known in the art.

Embodiments of the present invention suggest dynamically changing the biasing current of the amplifier circuitry in the SD-ADC in order to adjust the noise added by the amplifier to the maximum noise that can be tolerated, while still providing sufficient noise margin for the required resolution. By reducing the resolution required from the SD-ADC and the bias voltage to the amplifier, noise added by the SD-ADC integrator amplifiers can increase. If the noise added by the amplifiers is less than (or equal to) the maximum noise that can be tolerated, the power consumption of the SD-ADC can be reduced. As a result, the power consumption of the SD-ADC can be reduced.

In these embodiments, in step 314, the DSPHW 104 calculates the ENOB required for reception. In step 316, the DSPHW 104 uses a pre-known formula or a look-up table to determine the bias voltage required for the SD-ADC in order to produce the required ENOB. The DSPHW 104 then controls a switchable voltage source to produce the required biasing voltage and therefore change the power consumption of the SD-ADC.

In some embodiments, the SD-ADC can be designed as a second or higher order SD-ADC. For each order, the SD-ADC incorporates an integrator circuitry, typically implemented with an amplifier and a capacitor. When increasing the order of the SD-ADC, the over-sampling rate required to achieve a desired resolution can be reduced. Therefore, for a high resolution SD-ADC, it can be desirable to use a high order (e.g., second order or higher) design in order to reduce the sampling rate. However, the addition of amplification circuitry increases the power consumption of the SD-ADC. When a low resolution SD-ADC is required, a low order SD-ADC can be used. The considerations of designing a low or high order SD-ADC is well known in the art.

In these embodiments, the order of the SD-ADC may be dynamically changed in order to change the required resolution of the ADC. When a low resolution is needed, one or more integrator circuitries can be bypassed in the SD-ADC such that the order of the SD-ADC is dynamically reduced. Accordingly, the clocking rate of the SD-ADC is adjusted to provide the required resolution, considering the order of the SD-ADC.

In these exemplary embodiments, in step 314, the DSPHW 104 calculates the ENOB required for reception. In step 316, the DSPHW 104 uses a look-up table to determine a number of integrators (e.g., SD-ADC order) required to produce the required ENOB. The DSPHW 104 will control a switchable bypass circuitry to bypass or enable one or more integrators in the SD-ADC. The DSPHW 104 then programs the PLL 110 to produce the sampling clock at the required rate according to a known formula or the look-up table. The DSPHW 104 may also program the decimation filters subsequent to the SD-ADC in order to decimate the output of the SD-ADC into the desired resolution.

Embodiments of the present invention provide methods and systems for dynamically adjusting the resolution of the ADC 106 in order to adjust the power consumption of the ADC 106. The reconfiguration of the ADC 106 from one resolution to another may take a period of time, during which the output sample produced by the ADC 106 may be corrupted. The reconfiguration time may depend on the method used for changing the resolution of the ADC 106 and the specific design of the ADC 106. It is desirable to minimize an impact of samples lost during the ADC 106 reconfiguration based on a quality of the demodulated received signal.

In one exemplary embodiment, the received signal is modulated using orthogonal frequency division multiplexing (OFDM). A common modulation scheme in OFDM is to append a cyclic prefix or suffix to the OFDM symbol. The cyclic prefix or suffix is redundant data that is constructed by duplicating a portion of the OFDM symbol, and appending the duplicated portion to a start or an end of the OFDM symbol. Samples corresponding to the prefix or suffix may be redundant samples and may be discarded by the receiver device 100.

Figure 4:
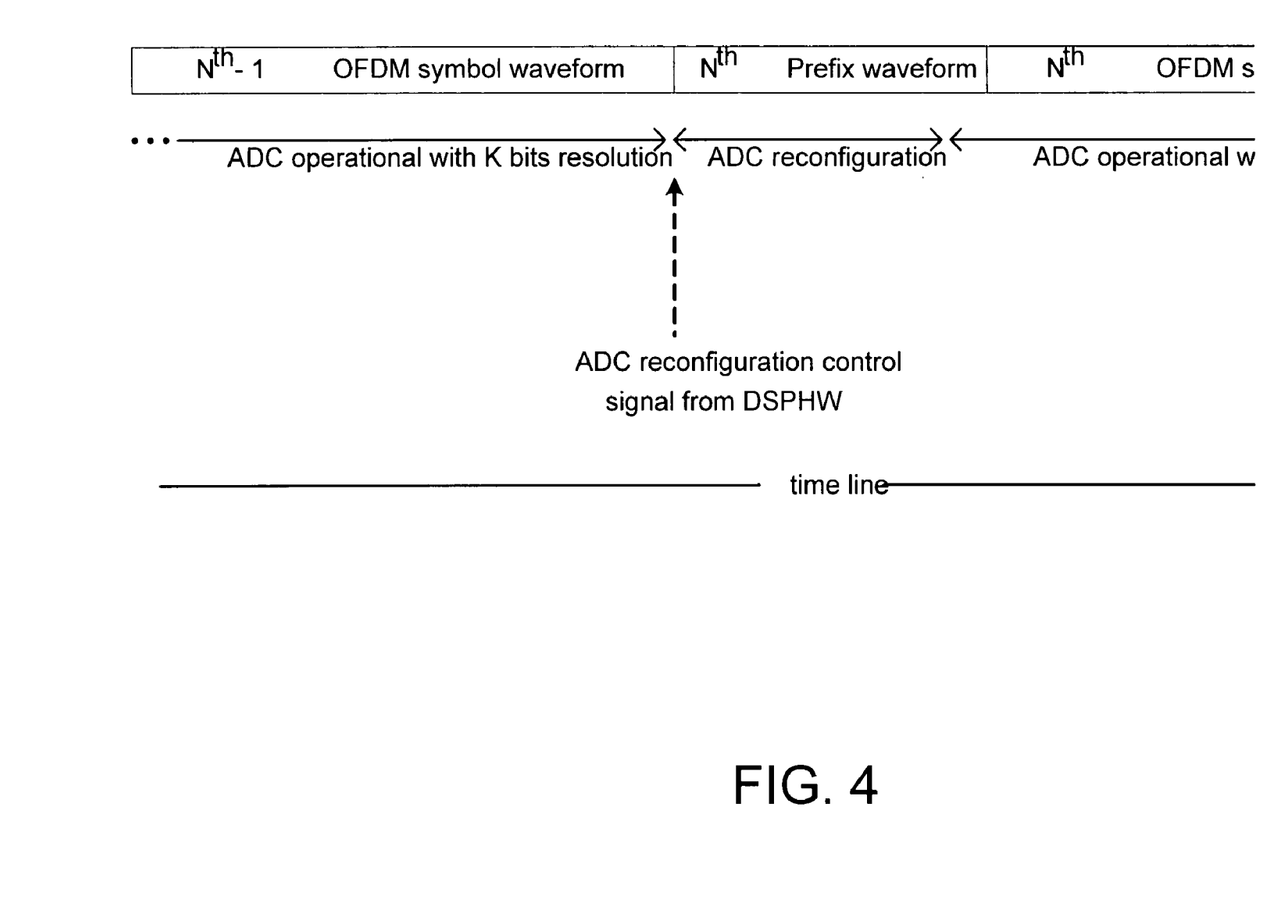
FIG. 4 is a time diagram of a start of A/D converter resolution reconfiguration in Orthogonal Frequency Division Multiplexing systems.

Referring now to FIG. 4, an exemplary schematic of a reconfiguration of the ADC resolution is shown. As part of the OFDM demodulation process, the DSPHW 104 implements an OFDM symbol synchronization algorithm. Such a synchronization algorithm is well known in the art. Using the synchronization algorithm, the DSPHW 104 establishes a start sample of a cyclic prefix. The DSPHW 104 then initiates a reconfiguration of the ADC 106 as described, for example, in step 316 at the start of the cyclic prefix or suffix. The reconfiguration process will therefore take place during a duration of the cyclic prefix or suffix. As a result, some or all of the samples that are corrupted because of the ADC 106 reconfiguration are prefix or suffix samples. Impact of these corrupted samples will be minimized because the receiver device 100 discards samples of the prefix or suffix.

Figure 5:
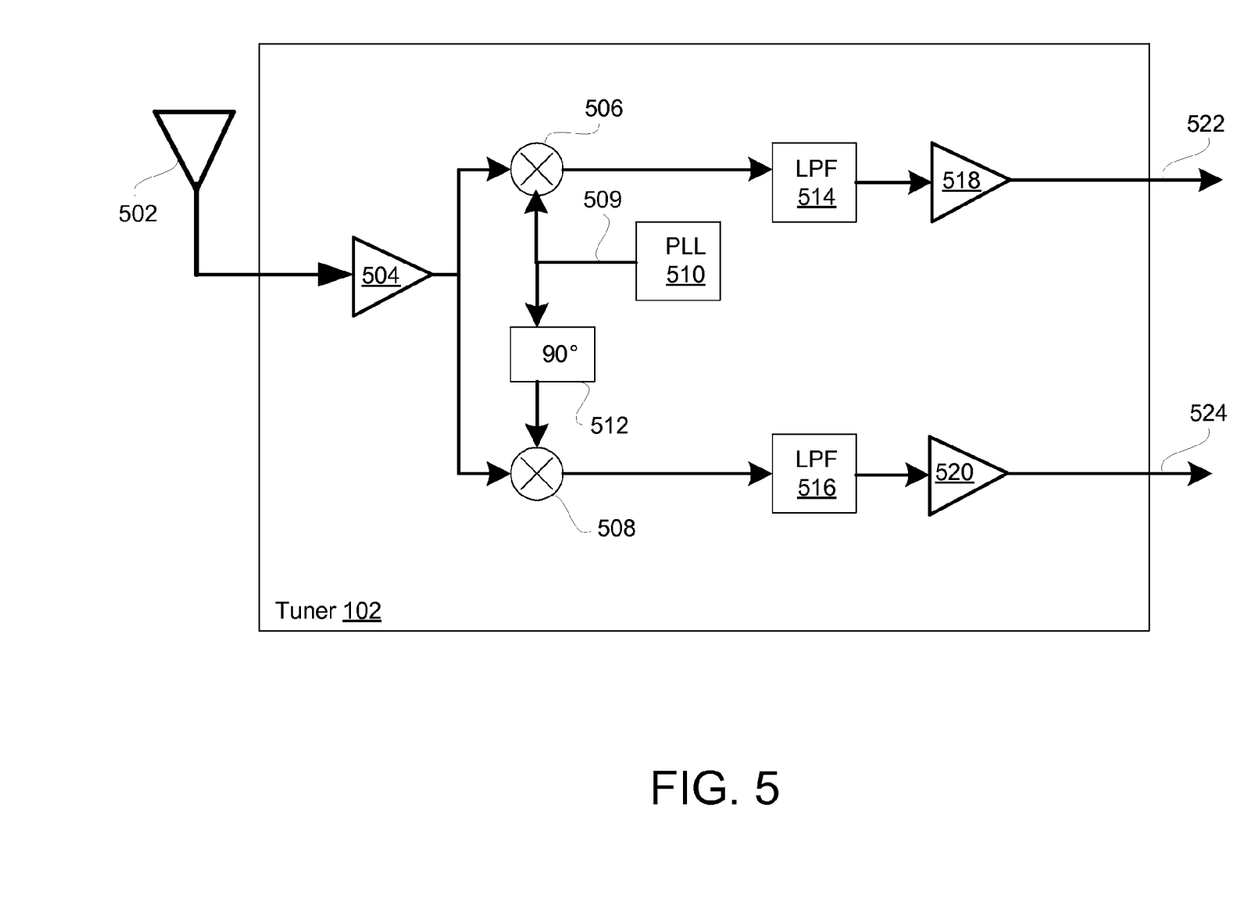
FIG. 5 is a block diagram of an exemplary tuner with direct conversion low IF architecture.

Further power optimization may be achieved by utilizing a receiver device 100 which uses a direct conversion from radio frequency (RF) into a low intermediate frequency (low-IF) in conjunction with the controllable ADC 106. Referring now to FIG. 5, an exemplary tuner 102 with a direct conversion, low-IF architecture is shown.

The exemplary tuner 102 receives an RF signal ($S_{rf}$) from the antenna 502. For illustration purposes, the RF signal comprises a desired signal ($S_{des}$) centered on a frequency ($F_c$), and an undesired adjacent signal ($S_{adj}$) centered on a frequency ($F_{ud}$) where $F_{ud}=F_c+F_{delta}$. "$F_{delta}$" is some frequency offset relative to "$F_c$."

The RF signal is amplified by a low noise amplifier 504. After amplification, the signal is split into mixers 506 and 508. In the mixer 506, the signal is multiplied with a local oscillator (LO) sine wave 509 received from a PLL 510. In the mixer 508, the signal is multiplied with a phase delayed version of the LO sine wave (via a 90° shifter 512). The output of the mixers 506 and 508 are filtered by low pass filters (LPF) 514 and 516, respectively. The signals are then gain adjusted by amplifiers 518 and 520, respectively.

The tuner 102 output signals 522 and 524 are then sampled by the ADCs (e.g., ADC 106 and ADC 108) in the receiver device 100. In exemplary embodiments, the output signal 522 is an in-phase signal, while the output signal 524 is a quadrature signal. The tuner 102 output signals 522 ($S_{inph}$) and 524 ($S_{quad}$) can be represented by the following equations:

$$S_{inph}(t)=G(t) \cdot S_{rf}(t) \cdot \cos(2 \cdot pi \cdot F_{lo} \cdot t) * H_{lpf}(t)$$

$$S_{quad}(t)=G(t) \cdot S_{rf}(t) \cdot \sin(2 \cdot pi \cdot F_{lo} \cdot t) * H_{lpf}(t),$$

where "G" is gain, "$F_{lo}$" is a local oscillator sign wave frequency, "$H_{lpf}$" is a time impulse response of the LPF 514 or 516, and "*" is a time convolution operation.

Figure 6:
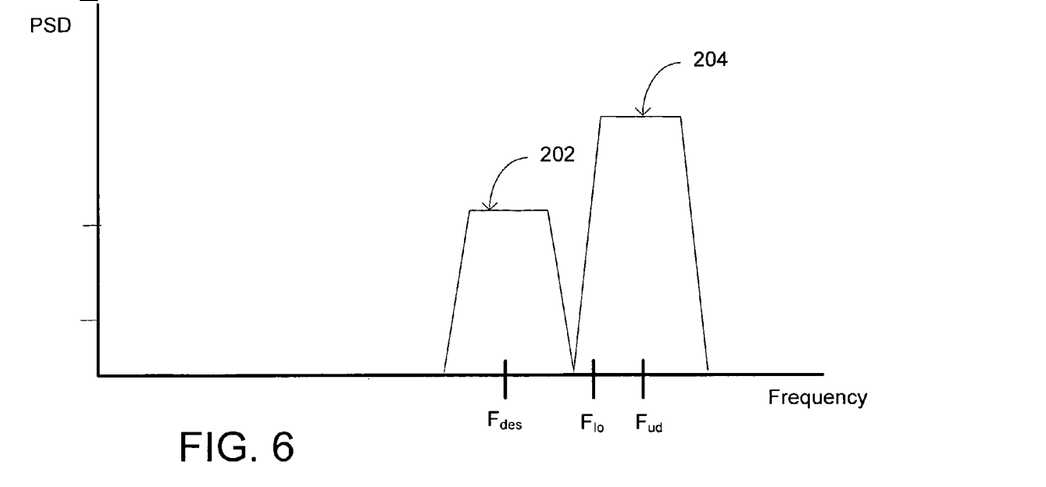
FIG. 6 is an example of a spectrum of desired and undesired signals.

In the low IF architecture, "$F_{lo}$" may be selected such that a desired signal is centered on "$F_{if}$." $F_{if}$ is an offset from the $F_c$. To achieve this, "$F_{if}$" can be chosen to be one of two options:

Upper sideband (USB) option: $F_{ifup}=F_c+F_{if}$
Lower sideband (LSB) option: $F_{iflow}=F_c-F_{if}$ FIG. 6 shows an example of a frequency spectrum of a signal of interest 202 in the presence of a strong power undesired adjacent blocker signal 204, where $F_c<F_{ud}$. In exemplary embodiments, "$F_{lo}$" in the USB option is between "$F_c$" and "$F_{ud}$."

Figure 7:
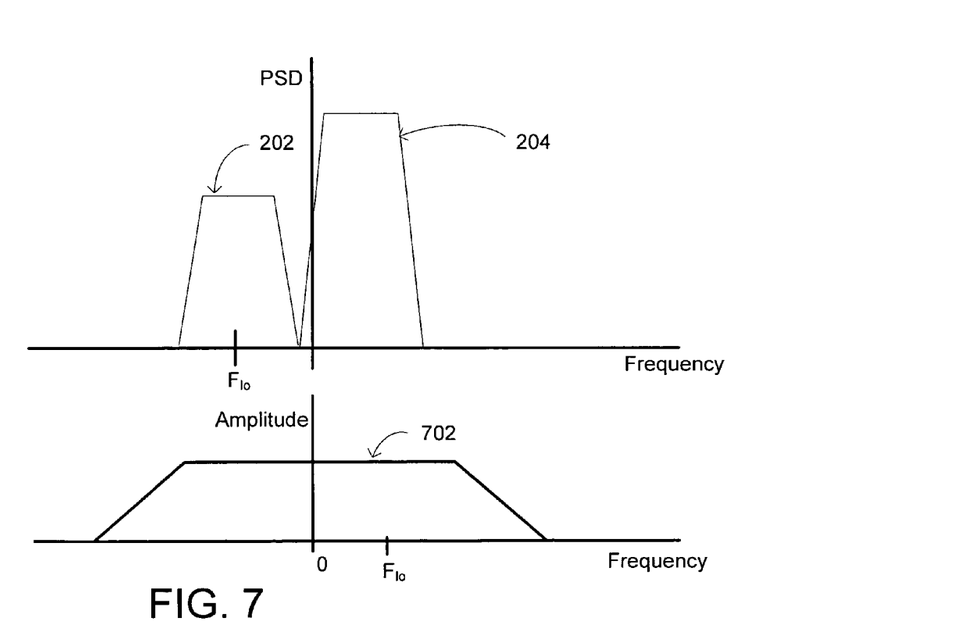
FIG. 7 is an example of a spectrum of desired and undesired signals at a turner output.

FIG. 7 shows a spectrum of signals at the output of the tuner 102 using a low IF architecture when the "$F_{ifup}$" is selected. The signal of interest 202 is now centered around "-$F_{if}$" near a zero frequency (DC). The undesired signal is centered on "$F_{udif}$" where $F_{udif}=F_{ud}-F_{lo}$. "$F_{udif}$" is a frequency of undesired signal of a low IF architecture. A frequency response 702 of the LPF 514 and 516 is also shown in FIG. 7 with respect to the desired and undesired signal spectrum. In this example, most of the energy of the undesired signal is within a pass band of the LPF 514 or 516. As a result, a majority of the power of the undesired signal will reach the ADCs 106 and 108. In embodiments where the undesired signal is stronger than the desired signal, the dynamic range required from the ADC 106 will increase to accommodate a high power of the undesired while maintaining enough signal-to-noise ratio (SNR) for the low power desired signal.

Figure 8:
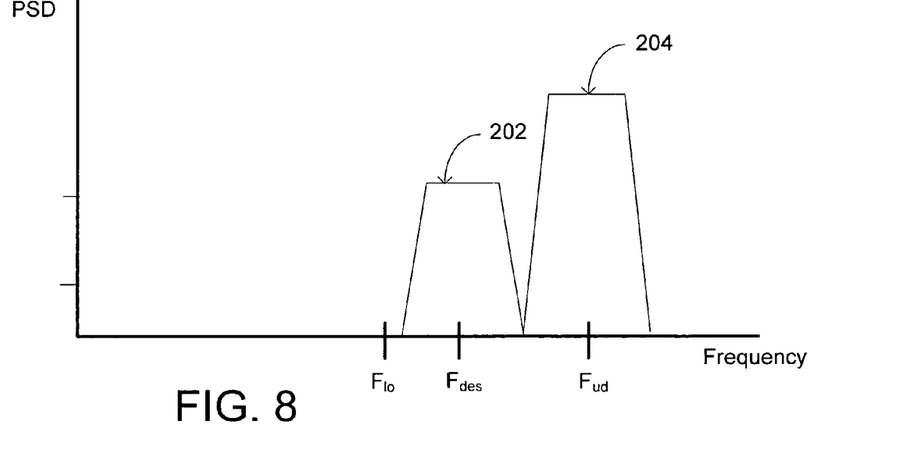
FIG. 8 is an alternative example of a spectrum of desired and undesired signals.

FIG. 8 shows the same spectrum of signals as FIG. 5, however, the "$F_{lo}$" is the LSB option. The LSB option comprises a "$F_{lo}$" located below "$F_c$."

Figure 9:
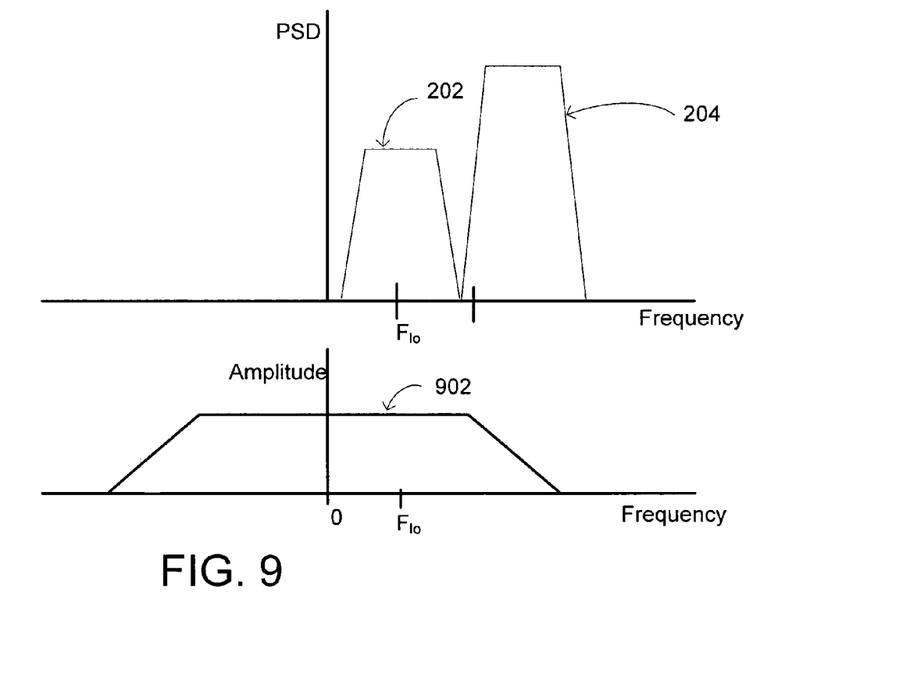
FIG. 9 is an alternative example of a spectrum of desired and undesired signals at a tuner output.

FIG. 9 shows a spectrum of the signals at the output of the tuner 102 when the "$F_{iflow}$" is selected. The signal of interest 202 is now centered around "+$F_{if}$" near the zero frequency (DC). The undesired signal is centered on "$F_{udif}$" where $F_{udif}=F_{ud}-F_{lo}$. A frequency response 902 of the LPF 514 and 516 is also shown in FIG. 9 with respect to the desired and undesired signal spectrum. In this example, most of the energy of the undesired signal is outside the pass band of the LPF 514 or 516. As a result, a majority of the power of the undesired signal is rejected by the LPF 514 or 516 and does not reach the ADCs 106 and 108. Therefore, the dynamic range required from the ADC 106 is reduced compared to the USB option.

In alternative embodiments, in cases where a high power adjacent signal is present and $F_c>F_{ud}$, if the USB option is used, the undesired signal will be rejected by the LPF 514 or 516. As a result, the dynamic range requirement of the ADC 106 is reduced. If the LSB option is used, the undesired signal will not be rejected and the dynamic range required from the ADC 106 will increase.

The above description provides embodiments in which the receiver device 100 is configured to select between the USB or the LSB option. The receiver device 100 may also be configured to measure a total power at the ADCs (e.g., ADC 106 and ADC 108) input for both selections of the "$F_{lo}$." Such measurements may be performed in the DSPHW 104 shown in FIG. 1. The DSPHW 104 may then select either the USB or the LSB option, in order to minimize the dynamic range of the ADC 106. By doing this, a reduction in the power consumption of the ADCs 106 and 108 is achieved.

Figure 10:
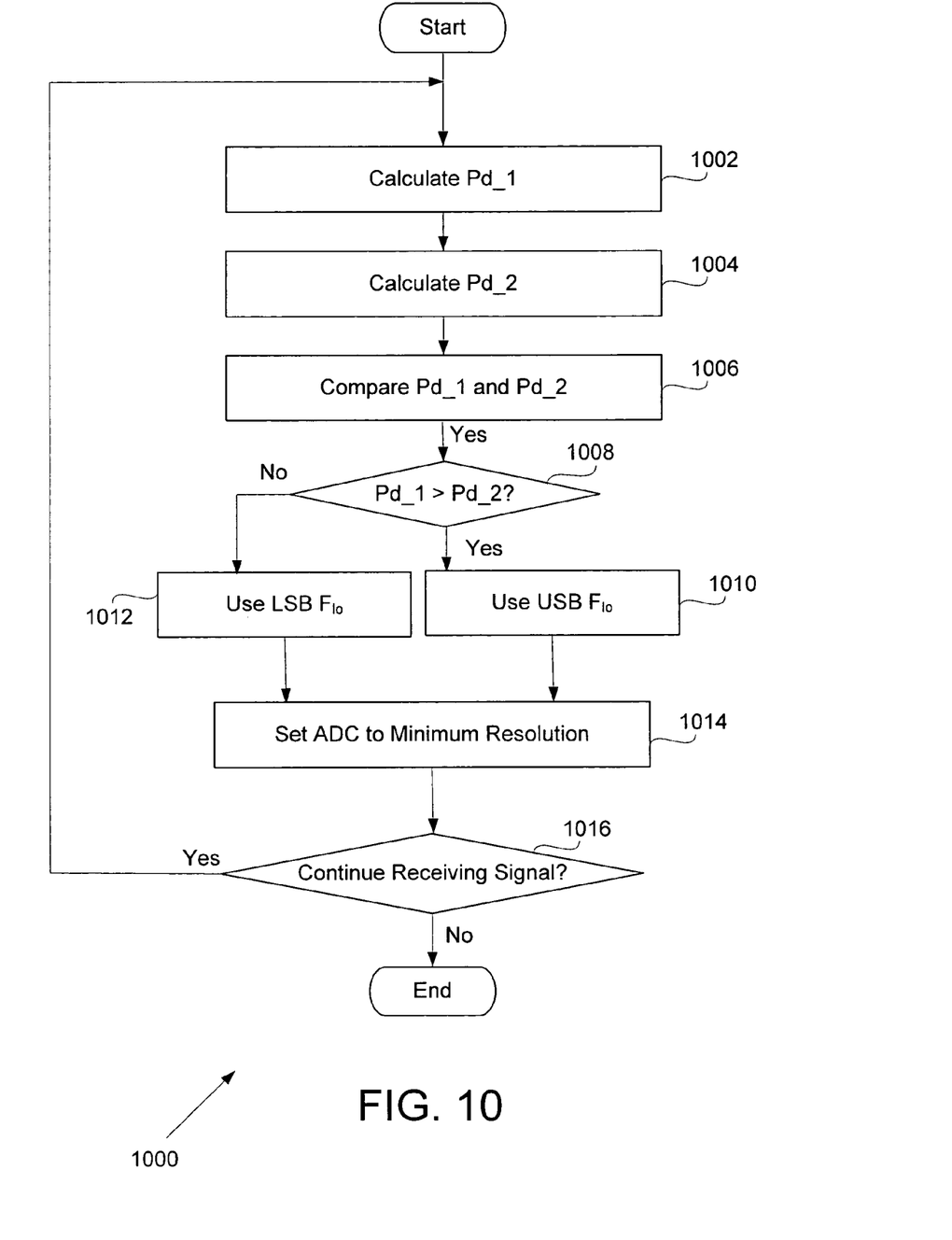
FIG. 10 is a flowchart of an exemplary method for monitoring and selecting between upper sideband and lower sideband options.

Referring now to FIG. 10, a flowchart 1000 of an exemplary method for monitoring and selecting between "$F_{lo}$" options is shown. In step 1002, the DSPHW 104 calculates Pd_1. Initially, the DSPHW 104 will program the tuner 102 to use a USB option (i.e., USB "$F_{lo}$"). This may occur when the receiver device 100 is tuning to a new channel, for example. The DSPHW 104 also measures a total power at an input of the ADC 106 and a power of a desired signal, as described herein. The DSPHW 104 then calculates Pd_1, where Pd_1=desired_power/total_power. Pd_1 is a percentage of total power which is the desired power at time (1).

In step 1004, the DSPHW 104 calculates Pd_2. The DSPHW 104 programs the tuner 102 to use a LSB option (i.e., LSB "$F_{lo}$"). The DSPHW 104 then measures the total power at the input of the ADC 106 and the power of the desired signal, as described herein. The DSPHW 104 then calculates Pd_2, where Pd_2=desired_power/total_power. Pd_2 is a percentage of the total power which is the desired power at time (2).

The DSPHW 104 compares Pd_1 to Pd_2, in step 1006. If Pd1>Pd_2 (step 1008), then the DSPHW 104 will program the tuner 102 to use the USB "$F_{lo}$" or option in step 1010. Alternatively, if Pd1<Pd_2, then the DSPHW 104 will program the tuner 100 to use the LSB "$F_{lo}$" or option in step 1012.

In step 1014, the DSPHW 104 sets the ADC 106 to a minimum resolution sufficient for reliable demodulation of the desired signal as described herein.

In step 1016, if a determination is made as to whether a signal is still be received by the receiving device 100. If so, the DSPHW 104 will recalculate Pd_1 and Pd_2. The DSPHW 104 then reprograms the USB "$F_{lo}$" or the LSB "$F_{lo}$" to the tuner 102.

In OFDM systems such as DVB-H and DAB/DVB-T, switching between the USB option and LSB option can be done during a cyclic prefix. By performing the switching in this manner, the reception of the signal while switching the option is not interrupted. In exemplary embodiments, a start time of the ADC resolution reconfiguration may be controlled by the DSPHW 104.

In time division multiplexed systems such as DAB/T-DMB, the switching between the USB option and LSB option can be performed during time slots which do not carry useful information for the receiver device 100. By performing the switching in this manner, the reception of the signal while switching the option is also not interrupted.

In continuously transmitting systems such as Frequency modulation (FM) broadcast, the recalculation of Pd_1 and Pd_2 and reprogramming of the "$F_{lo}$" can be performed in a short amount of time. As a result, the interruption in the reception of the signal is incomprehensible for the user.

Embodiments of the present invention have been described above with reference to exemplary embodiments. It will be apparent to those skilled in the art that various modifications may be made and other embodiments can be used without departing from the broader scope of the invention. Therefore, these and other variations upon the exemplary embodiments are intended to be covered by the present invention.

What is claimed is:

1. A system for power conservation in a receiver device, comprising:
   a tuner;
   a programmable analog-to-digital converter (ADC); and
   a digital signal processing hardware (DSPHW) including logic executable by the DSPHW to:
   configure the tuner to operate in a first mode,
   measure a first power of a desired signal and a first total power at an input of the ADC,
   determine a first ratio based at least in part on the first power of the desired signal and the first total power at the input of the ADC,
   configure the tuner to operate in a second mode,
   measure a second power of the desired signal and a second total power at the input of the ADC,
   determine a second ratio based at least in part on the second power of the desired signal and the second total power at the input of the ADC,
   configure the tuner to operate in the first mode or the second mode based at least in part on a comparison of the first ratio and the second ratio,
   measure a third power of the desired signal;
   generate a control signal to configure components within the receiver device to conserve power at the ADC,
   calculate an available noise margin between the third power of the desired signal and a noise floor,
   calculate a resolution of the ADC based at least in part on the available noise margin, and
   configure the ADC with the calculated resolution.

2. The system of claim 1 wherein the ADC switches between different output resolutions.

3. The system of claim 1 wherein the receiver components include a phase locked loop (PLL) that provides a sampling clock to the ADC.

4. The system of claim 1 wherein the receiver components include clock dividing circuitry that divides a sampling clock provided to the ADC.

5. The system of claim 1, wherein the tuner further includes an automatic gain controller that controls power of the received signal at an input to the ADC.

6. The system of claim 1 wherein the tuner includes a low-IF architecture.

7. The system of claim 1 wherein the ADC includes a Sigma Delta ADC.

8. The system for power conservation in a receiver device of claim 1 wherein the first mode is an upper sideband (USB) mode, the second mode is a lower sideband (LSB) mode, the first ratio is the first power of the desired signal to the first total power, the second ratio is the second power of the desired signal to the second total power, and the tuner is configured to operate in the USB mode when the first ratio is greater than the second ratio and configured to operate in the LSB mode when the first ratio is less than the second ratio.

9. A method for power conservation in a receiver device, comprising:
   receiving a signal at the receiver device, the receiver device including a programmable analog-to-digital converter (ADC), a tuner, and an oscillator;
   measuring a first power of the signal and a first total power at an input of the ADC,
   determining a first ratio based at least in part on the first power of the signal and the first total power at the input of the ADC,
   configuring the tuner to operate in a second mode,
   measuring a second power of the signal and a second total power at the input of the ADC,
   determining a second ratio based at least in part on the second power of the signal and the second total power at the input of the ADC,
   configuring the tuner to operate in the first mode or the second mode based at least in part on a comparison of the first ratio and the second ratio,
   measuring a third power of the signal;
   calculating an available noise margin between the third power of the signal and a noise floor;
   calculating a resolution for the ADC based at least in part on the available noise margin; and
   dynamically adjusting the resolution by adjusting the frequency of the local oscillator sine wave such that an effective dynamic range of the ADC is minimized to conserve power at the ADC while allowing for reliable demodulation of the signal, the adjustment of the frequency of the oscillator being based at least in part on a power of a desired signal.

10. The method of claim 9 wherein dynamically adjusting the resolution further comprises changing a sampling clock of the ADC.

11. The method of claim 9 wherein dynamically adjusting the resolution further comprises controlling a sampling frequency produced by a phase locked loop (PLL).

12. The method of claim 9 wherein dynamically adjusting the resolution further comprises controlling a sampling frequency produced by a clock dividing circuitry.

13. The method of claim 9 wherein dynamically adjusting the resolution further comprises changing a bias voltage of an amplifier circuitry.

14. The method of claim 9 wherein dynamically adjusting the resolution further comprises changing a number of integrator circuitries.

15. The method of claim 9 wherein dynamically adjusting the resolution further comprises controlling a start time of an ADC resolution reconfiguration.

16. The method of claim 9 wherein dynamically adjusting the resolution further comprises controlling gain of at least one automatic gain control.

17. The method of claim 9 wherein dynamically adjusting the resolution further comprises determining a new dynamic range of the ADC.

18. The method of claim 9 wherein the resolution for the ADC is determined for a Sigma Delta ADC.

19. The method for power conservation in a receiver device of claim 9 wherein the first mode is an upper sideband (USB) mode, the second mode is a lower sideband (LSB) mode, the first ratio is the first power of the desired signal to the first total power, the second ratio is the second power of the desired signal to the second total power and the tuner is configured to operate in the USB mode when the first ratio is greater than the second ratio and configured to operate in the LSB mode when the first ratio is less than the second ratio.

* * * * *